(12) United States Patent
Iwasaki et al.

(10) Patent No.: US 10,283,429 B2
(45) Date of Patent: May 7, 2019

(54) SEMICONDUCTOR DEVICE (71) Applicants: Toyota Jidosha Kabushiki Kaisha, Toyota-shi, Aichi-ken (JP); Denso Corporation, Kariya-shi, Aichi-ken (JP)

(72) Inventors: Shingo Iwasaki, Toyota (JP); Tomomi Okumura, Kariya (JP)

(73) Assignees: Toyota Jidosha Kabushiki Kaisha, Toyota-shi (JP); Denso Corporation, Kariya-shi (JP)

( * ) Notice: Subject to any disclaimer, the term of this patent is extended or adjusted under 35 U.S.C. 154(b) by 0 days.

(21) Appl. No.: 15/274,247

(22) Filed: Sep. 23, 2016

(65) Prior Publication Data

US 2017/0092559 A1 Mar. 30, 2017

(30) Foreign Application Priority Data

Sep. 25, 2015 (JP) ................. 2015-188240

(51) Int. Cl.
*H01L 23/31* (2006.01)
*H01L 23/373* (2006.01)
(Continued)

(52) U.S. Cl.
CPC ...... *H01L 23/3142* (2013.01); *H01L 23/3735* (2013.01); *H01L 23/4334* (2013.01); *H01L 23/051* (2013.01); *H01L 23/3107* (2013.01); *H01L 24/06* (2013.01); *H01L 24/29* (2013.01); *H01L 24/32* (2013.01); *H01L 24/33* (2013.01); *H01L 24/48* (2013.01); *H01L 24/73* (2013.01); *H01L 2224/04026* (2013.01);
(Continued)

(58) Field of Classification Search
CPC . H01L 2224/32245; H01L 2224/33181; H01L 23/3142; H01L 23/3675; H01L 24/33; H01L 25/18; H01L 2924/1203; H01L 2924/13055; H01L 23/49568; H01L 23/3107; H01L 23/3157; H01L 23/49541
See application file for complete search history.

(56) References Cited

U.S. PATENT DOCUMENTS

2010/0238632 A1* 9/2010 Shiraki ................ H02M 7/003 361/709
2015/0162274 A1 6/2015 Kadoguchi et al.
(Continued)

FOREIGN PATENT DOCUMENTS

CN 104701306 A 6/2015
JP 2003124406 A * 4/2003 ............ H01L 24/33
(Continued)

*Primary Examiner* — Frederick B Hargrove
(74) *Attorney, Agent, or Firm* — Dinsmore & Shohl LLP (57) ABSTRACT

A semiconductor device includes: a semiconductor element; a heat sink including a first surface and a second surface, the semiconductor element being joined to the first surface, the second surface being a surface on an opposite side of the first surface; and a package that is in contact with the semiconductor element and the first surface of the heat sink, the package including a recess portion in an outer face, wherein the heat sink includes a thick portion, and a thin portion having a thickness that is smaller than that of the thick portion, and the thin portion is located on a line connecting an outer face of the semiconductor element and the recess portion in a shortest distance.

9 Claims, 6 Drawing Sheets (51) Int. Cl.
*H01L 23/433* (2006.01)
*H01L 23/00* (2006.01)
*H01L 23/051* (2006.01)

(52) U.S. Cl.
CPC ............. *H01L 2224/04042* (2013.01); *H01L 2224/06181* (2013.01); *H01L 2224/291* (2013.01); *H01L 2224/32245* (2013.01); *H01L 2224/33181* (2013.01); *H01L 2224/48247* (2013.01); *H01L 2224/73215* (2013.01); *H01L 2224/73265* (2013.01); *H01L 2924/00014* (2013.01); *H01L 2924/1203* (2013.01); *H01L 2924/1815* (2013.01)

(56) References Cited

U.S. PATENT DOCUMENTS

2015/0270204 A1* 9/2015 Kuroda ................... H01L 24/33
    257/675
2016/0343630 A1* 11/2016 Kadoguchi ........... H01L 23/051

FOREIGN PATENT DOCUMENTS

| JP | WO 2014002442 A1 * | 1/2014 | ......... H01L 23/4334 |
| JP | 2014-154779 A | 8/2014 | |
| JP | 2015-130465 A | 7/2015 | |
| JP | WO 2015097521 A2 * | 7/2015 | ........... H01L 23/051 |

* cited by examiner

SEMICONDUCTOR DEVICE

CROSS-REFERENCE TO RELATED APPLICATIONS

The present disclosure claims priority to Japanese Patent Application No. 2015-188240 filed on Sep. 25, 2015, which is incorporated herein by reference in its entirety including the specification, drawings and abstract.

BACKGROUND

1. Field of the Disclosure

The present disclosure relates to a semiconductor device.

2. Description of Related Art

Japanese Patent Application Publication No. 2014-154779 discloses a semiconductor device including semiconductor elements fixed to heat sinks, a periphery of the semiconductor elements being sealed by resin molding. Each semiconductor element includes an outer peripheral end face, and each heat sink includes an inner face, an outer face and an outer peripheral end face. The semiconductor elements are fixed to inner faces of the respective heat sinks, and the respective outer peripheral end faces of the semiconductor elements fixed to the heat sinks are exposed. The molded resin covers the outer peripheral end face of each semiconductor element, the inner face of each heat sink (the inner face except an area in which the relevant semiconductor elements are fixed) and the outer peripheral end face of each heat sink. The outer face of each heat sink is not covered by the molded resin and can be brought into contact with, e.g., a cooler. The molded resin forms a package of the semiconductor device and protects the semiconductor elements.

Recess portions are formed in an outer peripheral end face of the molded resin, and, for example, a creepage distance along a surface of the molded resin is secured, or fluidity of a molding resin during molding is improved, by the recess portions. For various reasons, recess portions may be formed in the outer peripheral end face of the molded resin.

SUMMARY

During operation of the semiconductor device, the semiconductor elements generate heat, and the heat sinks thereby thermally expand and the package also thermally expands. Because of a difference in thermal expansion coefficient between the heat sinks and the package, stress acts on both the heat sink and the package. In such cases, as in JP 2014-154779 A, formation of recess portions in an outer peripheral end face of a molded resin causes the stress to be concentrated on the recess portions. In order to reduce stress on a package, a structure in which heat sinks are downsized may be employed. This structure enables increase of a distance between recess portions and the heat sinks, and thus enables reduction of stress on the recess portions. However, the downsizing of the heat sinks results in decrease in area of contact between the heat sinks and the package. The present disclosure provides a technique that reduces stress imposed on recess portions during operation of a semiconductor device while maintaining semiconductor element protection performance.

A first aspect of a semiconductor device according to the present disclosure includes a semiconductor element including an outer peripheral end face, a heat sink including an inner face, an outer face and an outer peripheral end face, the semiconductor element being fixed to the inner face, and a package covering the outer peripheral end face of the semiconductor element, the inner face of the heat sink except an area to which the semiconductor element is fixed and the outer peripheral end face of the heat sink. The outer face of the heat sink is not covered by the package. A recess portion is formed in an outer peripheral end face of the package. In planar view of the heat sink in a direction in which the semiconductor element and the heat sink are stacked, the heat sink includes a thin area having a thickness that is smaller than that of a part surrounding the thin area, within an area connecting the semiconductor element and the recess portion.

The semiconductor device includes a recess portion formed in an outer peripheral end face of a package, and a heat sink including a thin area. The thin area is present within an area connecting a semiconductor element and the recess portion in planar view of the heat sink. In the semiconductor device, even if the semiconductor element generates heat and the heat sink thereby thermally expands, the presence of the thin area in the aforementioned area of the heat sink enables reduction in stress generated on the recess portion.

In the above aspect, a part of the second surface of the heat sink may be exposed from the package.

In the above aspect, the package may include a resin.

The semiconductor device in the above aspect may further include a control electrode for inputting a control signal to the semiconductor element, wherein the heat sink may include a projection portion exposed outside the package, the control electrode and the projection portion may have different electric potentials, and the recess portion may be disposed between the control electrode and the projection portion.

In the above aspect, the semiconductor element may have a polygonal shape having outer sides, the recess portion may be a rectangular cutout, the thin portion may be located in a region connecting opposite ends of the outer side closest to the recess portion and opposite ends of a bottom face of the cut out as the cutout is viewed from an upper side.

In the above aspect, in the thin portion, the second surface may be dented.

In the above aspect, the heat sink may have a polygonal shape including outer sides, and the thin portion may be formed along the outer side closest to the recess portion.

In the above aspect, the thin portion may be surrounded by the thick portion.

BRIEF DESCRIPTION OF THE DRAWINGS

Features, advantages, and technical and industrial significance of exemplary embodiments of the disclosure will be described below with reference to the accompanying drawings, in which like numerals denote like elements, and wherein.

DETAILED DESCRIPTION OF EMBODIMENTS

Figure 2:
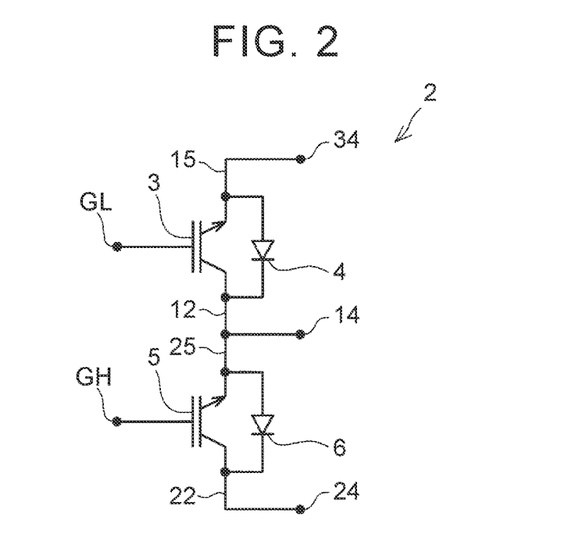
FIG. 2 is a diagram of an electric circuit in the semiconductor device according to Embodiment 1.

A semiconductor device 2 according to Embodiment 1 will be described with reference to the drawings. FIG. 2 is a diagram of a circuit incorporated in the semiconductor device 2. The semiconductor device 2 includes a first transistor element 3, a second transistor element 5, a first diode element 4, a second diode element 6, an N terminal 34, an O terminal 14 and a P terminal 24. Each of the first transistor element 3, the second transistor element 5, the first diode element 4 and the second diode element 6 has an ampacity of 100 amperes or more, and belongs to a power semiconductor element mainly used for electric power conversion. The semiconductor device 2 typically forms a part of an inverter circuit that supplies electric power to a drive motor in, e.g., an electric vehicle, a hybrid vehicle or a fuel cell vehicle.

The first transistor element 3 and the second transistor element 5 are connected in series. The first diode element 4 is connected in inverse parallel with the first transistor element 3, and the second diode element 6 is connected in inverse parallel with the second transistor element 5. The N terminal 34 is connected to a negative terminal of a non-illustrated direct-current power supply, the P terminal 24 is connected to a positive terminal of the direct-current power supply, and the O terminal 14 is connected to a coil of the drive motor. Reference symbol GL denotes a gate terminal of the first transistor element 3, and reference symbol GH denotes a gate terminal of the second transistor element 5. Reference numerals 15, 12, 25, 22 each denote a heat sink, which will be described later with reference to FIG. 3 onwards, the heat sink doubling as an electrically conductive path.

Figure 3:
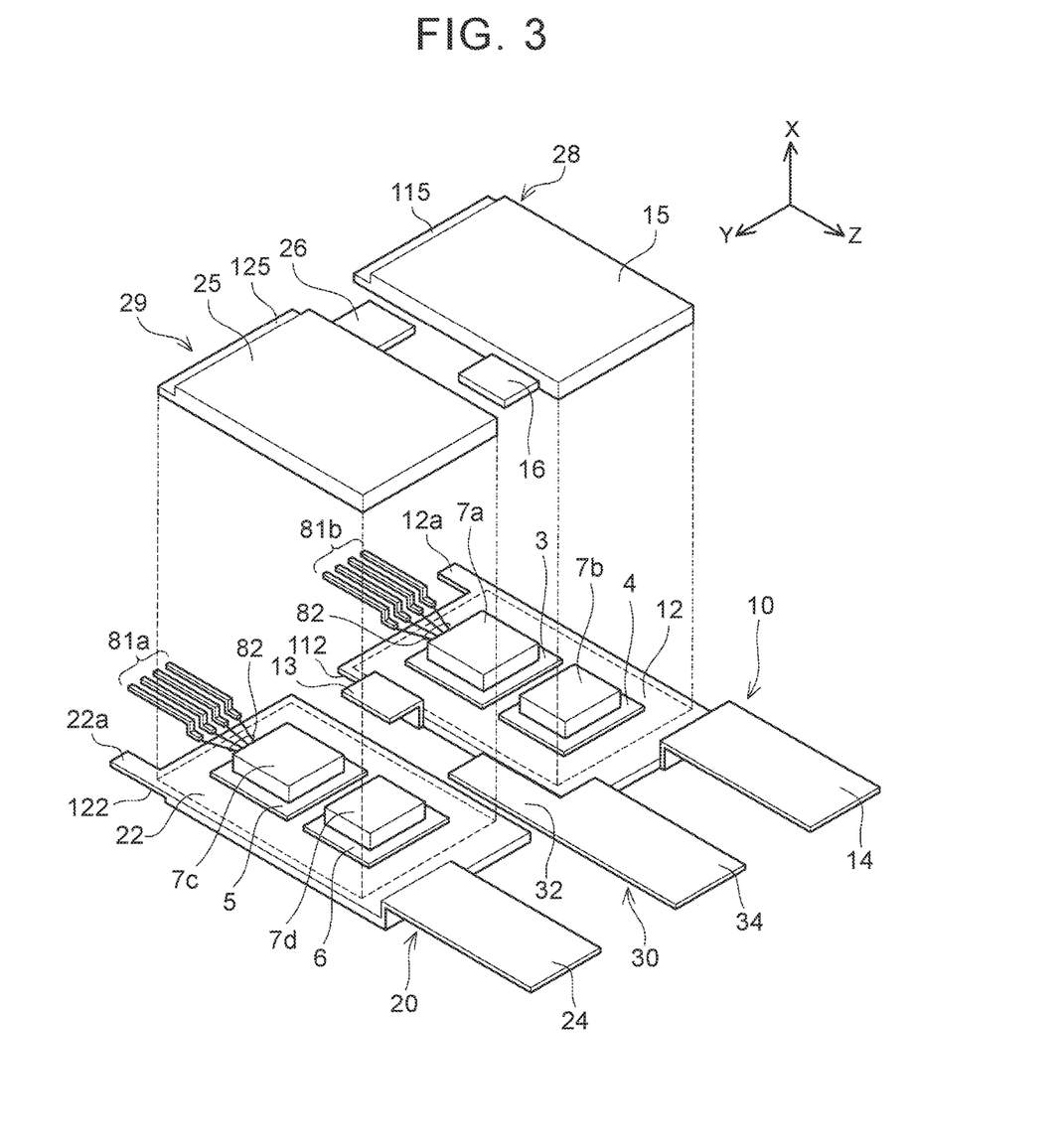
FIG. 3 is a partially-exploded view of the semiconductor device (except a package) according to Embodiment 1.
Figure 4:
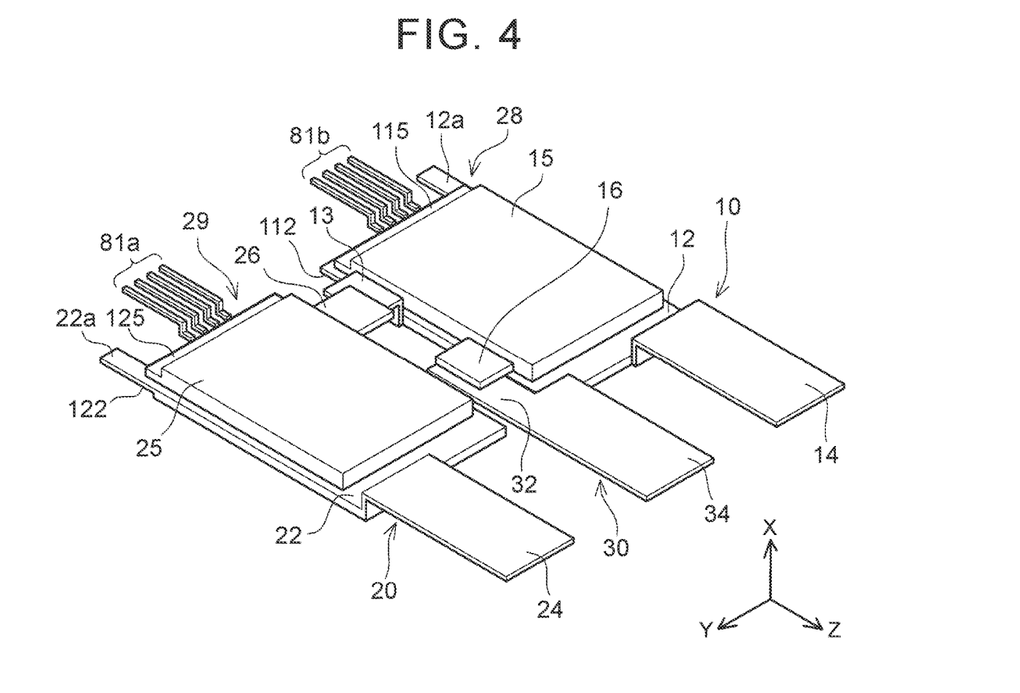
FIG. 4 is a perspective view of the semiconductor device (except the package) according to Embodiment 1.

FIG. 3 is a diagram of components of the semiconductor device 2 except a package 9 with the heat sinks 15, 25 separated. FIG. 4 is a perspective of the semiconductor device 2 except the package 9. For convenience of description, the positive direction on the X-axis in the coordinate system in the figure is referred to "upper", and the negative direction on the X-axis is referred to as "lower". Expressions using "upper" and "lower" may be used also for the subsequent drawings.

A joint portion 32 extends from an edge of the N terminal 34. The N terminal 34 and the joint portion 32 are collectively referred to as a negative electrode terminal 30. A joint portion 16 extends from an edge of the heat sink 15. The heat sink 15 and the joint portion 16 are collectively referred to as a first relay plate 28. The joint portion 16 of the first relay plate 28 faces the joint portion 32 of the negative electrode terminal 30, and the joint portion 16 and the joint portion 32 are fixed. In the below embodiments, fixing a positional relationship between two components and providing electrical conduction between the two components is simply expressed using the term "fix".

The first transistor element 3 is fixed to an inner face (lower face) of the heat sink 15 via a spacer 7a, and the first diode element 4 is fixed to the inner face (lower face) of the heat sink 15 via a spacer 7b. The first transistor element 3 has a flat-plate shape, and on a part of an upper face of the first transistor element 3, an emitter electrode is disposed, and on a lower face of the first transistor element 3, a collector electrode is disposed. There is an area in which the emitter electrode is not formed in the upper face of the first transistor element 3, and on that area, a gate electrode and other signal terminals are disposed. On an upper face of the first diode element 4, an anode electrode is disposed, and on a lower face of the first diode element 4, a cathode electrode is disposed. The collector electrode of the first transistor element 3 and the cathode electrode of the first diode element 4 are fixed to an inner face (upper face) of the heat sink 12. Respective one ends of bonding wires 82 are fixed to the gate electrode and the other signal terminals formed on the upper face of the first transistor element 3. Respective other ends of the bonding wires 82 are fixed to respective control terminals 81b. A first joint portion 13, the O terminal 14 and the projection part 12a extend from the heat sink 12. The projection part 12a is a part remained after a suspension lead terminal being cut off, the suspension lead terminal being provided to support the heat sink when the semiconductor device is subjected to molding. The projection part 12a and the heat sink 12 have a same electric potential. The heat sink 12, the first joint portion 13, the O terminal 14 and the projection part 12a are collectively referred to an intermediate terminal 10.

The heat sink 25 includes a second joint portion 26. The heat sink 25 and the second joint portion 26 are collectively referred to a second relay plate 29. The second joint portion 26 and the first joint portion 13 are fixed so as to face each other. The second transistor element 5 is fixed to an inner face (lower face) of the heat sink 25 via a spacer 7c, and the second diode element 6 is fixed to the inner face (lower face) of the heat sink 25 via a spacer 7d. The second transistor element 5 has a flat-plate shape, and on a part of an upper face of the second transistor element 5, an emitter electrode is disposed, and on a lower face of the second transistor element 5, a collector electrode is disposed. There is an area in which the emitter electrode is not formed in the upper face of the second transistor element 5, and on that area, a gate electrode and other signal terminals are disposed. On an upper face of the second diode element 6, an anode electrode is disposed, and on a lower face of the second diode element 6, a cathode electrode is disposed. The collector electrode of the second transistor element 5 and the cathode electrode of the second diode element 6 are fixed to an inner face (upper face) of the heat sink 22. Respective one ends of bonding wires 82 are fixed to the gate electrode and the other signal terminals formed on the upper face of the second transistor element 5. Respective other ends of the bonding wires 82 are fixed to respective control terminals 81a. The P terminal 24 and a projection part 22a extend from the heat sink 22. The projection part 22a is a part remained after a suspension lead terminal being cut off, the suspension lead terminal being provided to support the heat sink when the semiconductor device is subjected to molding. The projection part 22a and the heat sink 22 have a same electric potential. The heat sink 22, the P terminal 24 and the projection part 22a are collectively referred to as a positive electrode terminal 20.

The intermediate terminal 10, the positive electrode terminal 20, the negative electrode terminal 30, the first relay plate 28, the second relay plate 29 and the control terminals 81a, 81b are partially electrically connected to semiconductor elements such as the first transistor element 3 inside the package 9, and are partially exposed outside the package 9. Such electrically conductive materials are collectively referred to as a lead frame. The package 9 may be formed of, e.g., a resin, and holds parts of respective components included in the semiconductor device such as the intermediate terminal 10, the positive electrode terminal 20, the negative electrode terminal 30, the first relay plate 28, the second relay plate 29 and the control terminals 81a, 81b.

Figure 1:
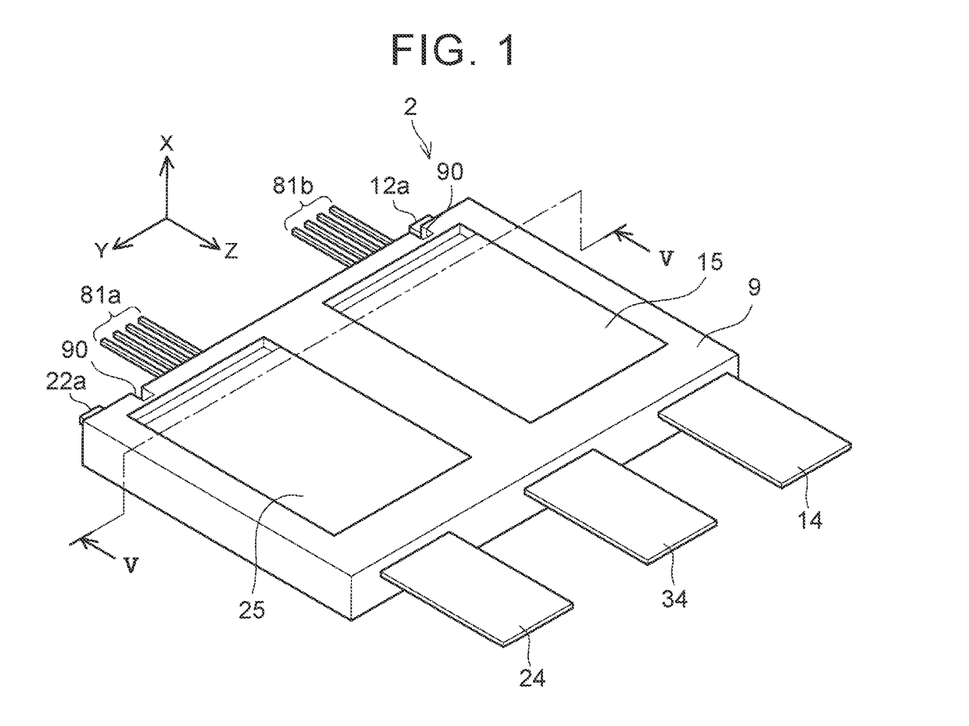
FIG. 1 is a perspective view of a semiconductor device according to Embodiment 1.

As illustrated in FIG. 1, outer faces (upper faces) of the heat sinks 15, 25 are exposed in an upper face of the package 9. Although hidden and cannot be seen in FIG. 1, outer faces (lower faces) of the heat sinks 12, 22 are exposed in a lower face of the package 9. The O terminal 14, the N terminal 34, the P terminal 24, the control terminals 81a, 81b and the projection parts 12a, 22a extend from respective side faces of the package 9 in a Z direction.

Figure 5:
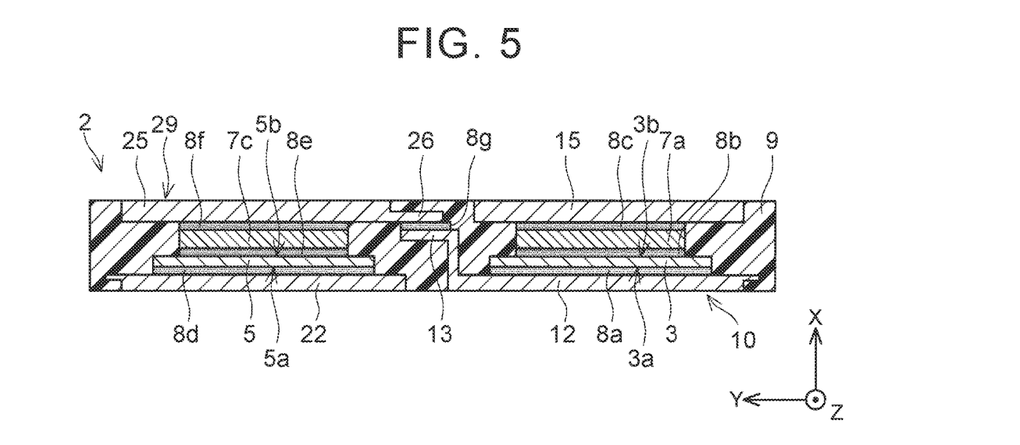
FIG. 5 is a vertical sectional view along line V-V in FIG. 1.

A relationship in fixing among the first transistor element 3, the second transistor element 5 and the lead frame will be described with reference to FIG. 5. FIG. 5 is a sectional view along line V-V in FIG. 1. As described above, the collector electrode 3a is disposed on the lower face of the first transistor element 3, and the emitter electrode 3b is disposed on the upper face of the first transistor element 3. The heat sink 12 and the collector electrode 3a of the first transistor element 3 are fixed by a solder layer 8a. The emitter electrode 3b of the first transistor element 3 and the spacer 7a are fixed by a solder layer 8b. The spacer 7a and the heat sink 15 are fixed by a solder layer 8c.

The collector electrode 5a is disposed on the lower face of the second transistor element 5, and the emitter electrode 5b is disposed on the upper face of the second transistor element 5. The heat sink 22 and the collector electrode 5a of the second transistor element 5 are fixed by a solder layer 8d. The emitter electrode 5b of the second transistor element 5 and the spacer 7c are fixed by a solder layer 8e. The spacer 7c and the heat sink 25 are fixed by a solder layer 8f.

A relationship in connection between the first transistor element 3 and the second transistor element 5 is as follows. The first transistor element 3 and the second transistor element 5 are electrically connected via the intermediate terminal 10 and the second relay plate 29. The collector electrode 3a disposed on the lower face of the first transistor element 3 is connected to the first joint portion 13 by the intermediate terminal 10. The emitter electrode 5b disposed on the upper face of the second transistor element 5 is connected to the second joint portion 26 by the second relay plate 29. The first joint portion 13 and the second joint portion are connected by a solder layer 8g. Because of the respective connections to the first joint portion 13 and the second joint portion 26, the collector electrode 3a of the first transistor element 3 and the emitter electrode 5b of the second transistor element 5 are connected.

A relationship in fixing between the first diode element 4 and the lead frame will be described with reference to FIG. 7. As described above, the cathode electrode 4a is disposed on the lower face of the first diode element 4, and the anode electrode 4b is disposed on the upper face of the first diode element 4. The heat sink 12 and the cathode electrode 4a of the first diode element 4 are fixed by a solder layer 8h. The anode electrode 4b of the first diode element 4 and the spacer 7b are fixed by a solder layer 8i. The spacer 7a and the heat sink 15 are fixed by a solder layer 8j.

Figure 6:
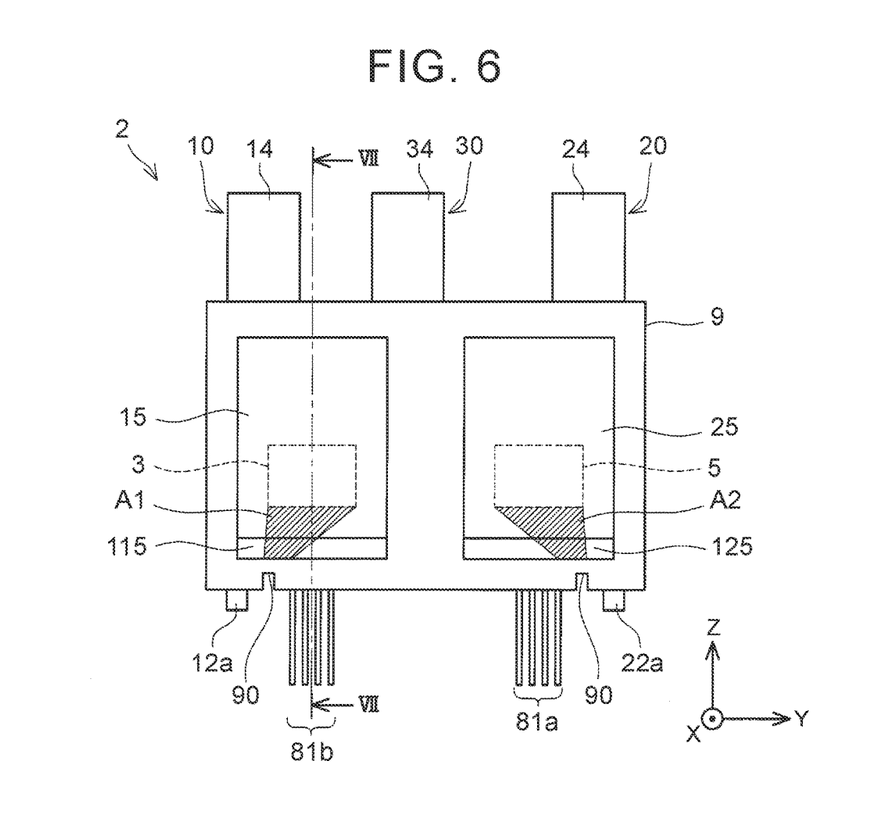
FIG. 6 is a plan view of the semiconductor device according to Embodiment 1.

Next, outer configurations of the package 9 and the heat sinks of the semiconductor device 2 will be described. As illustrated in FIG. 6, in an outer peripheral end face of the package 9, in planar view in the X direction, a recess portion 90 is formed between the control terminals 81a and the projection part 22a, and a recess portion 90 is formed between the control terminals 81b and the projection part 12a. The recess portions 90 extend through, from the upper face to the lower face of, the package 9 in the X direction.

In the semiconductor device 2 according to Embodiment 1, a creepage distance between the control terminals 81a and the projection part 22a and a creepage distance between the control terminals 81b and the projection part 12a along a surface of the package 9 can be secured by the respective recess portions 90 formed in the outer peripheral end face of the package 9.

Figure 7:
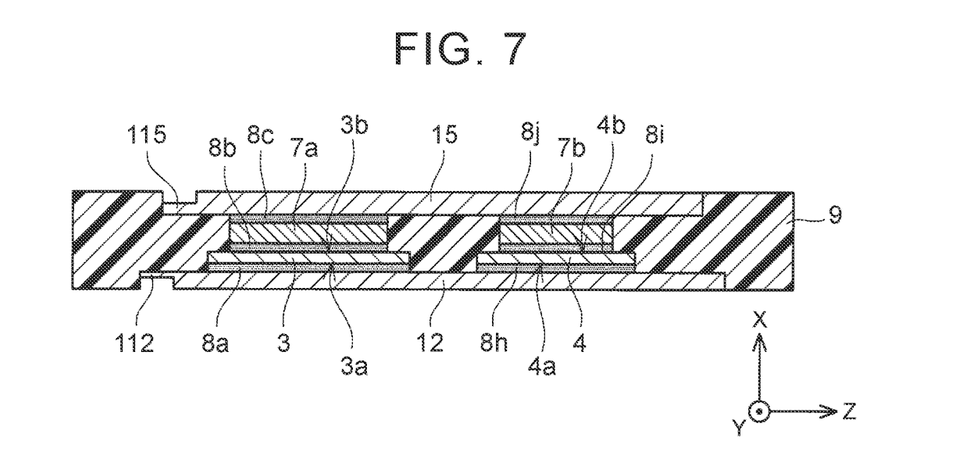
FIG. 7 is a vertical sectional view along line VII-VII in FIG. 6.

As illustrated in FIGS. 3 and 7, in the heat sinks 12, 15, 22, 25, respective thin portions 112, 115, 122, 125 each having a thickness that is smaller than that of the other parts are formed. As illustrated in FIG. 3, the thin portion 125 is an end portion in the negative direction on the Z axis of the heat sink 25, which is formed along one side extending in the Y direction in such a manner that a part of the end portion is cut out up to a depth of an intermediate position from an outer face thereof. More specifically, the thin portion 125 is configured in such a manner that an outer face of the heat sink 25 is dented. Each of the thin portions 112, 115, 122 has a configuration similar to that of the above-described thin portion 125. Also, the upper faces of the heat sinks 15, 25 (parts except the thin portions 115, 125) are present on a substantially same plane with the upper face of the package 9, and the lower faces of the heat sinks 12, 22 (parts except the thin portions 112, 122) are present on a substantially same plane with the lower face of the package 9. The upper faces of the heat sinks 15, 25 (parts except the thin portions 115, 125) are exposed in the upper face of the package 9, and the lower faces of the heat sinks 12, 22 (parts except the thin portions 112, 122) are exposed in the lower face of the package 9. The exposed heat sinks 12, 15 can be brought into contact with a cooler via an insulating layer. The same applies to the exposed heat sinks 22, 25. In some embodiments, each of the thin portions are formed at a position at which the thin portion does not overlap with the relevant power semiconductor element in planar view in the X direction. Such configuration enables heat of the power semiconductor element to be released efficiently.

As illustrated in FIG. 7, the package 9 is in close contact with respective outer peripheral end faces of the first transistor element 3 and the first diode element 4, the upper face (inner face) of the heat sink 12 and the lower face (inner face) of the heat sink 15, an outer peripheral end face of the heat sink 12 (outer peripheral end face of the thin portion 112), and an outer peripheral end face of the heat sink 15 (outer peripheral end face of the thin portion 115). In Embodiment 1, the package 9 is not formed, that is, there is a void, on an upper face of the thin portion 115 and a lower face of the thin portion 112. The same applies to a relationship between the package 9 and the heat sinks 22, 25.

In the semiconductor device 2 of Embodiment 1, within an area of each heat sink, the area connecting the relevant power semiconductor element and the relevant recess portion (hatched areas A1, A2 in FIG. 6), the relevant thin portion 112, 115, 122, 125 is formed. In other words, each of the thin portions 112, 115, 122, 125 is formed on a line connecting the relevant power semiconductor element and the relevant recess portion in a shortest distance. The relationship in position between the power semiconductor elements and the recess portions, and the thin portion applies to the other embodiments. Therefore, even if the power semiconductor elements generate heat and the heat sinks thereby thermally expand, concentration of stress on the recess portions can be reduced by the thin portions formed in the heat sinks. Also, the area of close contact between the heat sinks and the package 9 on a Y-Z plane can be secured without decrease of the areas of the heat sinks, enabling maintenance of power semiconductor element protection performance.

In the semiconductor device according to Embodiment 1, the thin portions are formed in respective parts of the areas A1, A2 in the Z direction, and the thin portions are formed over the respective entire lengths of the areas A1, A2 in the Y direction, and the thin portions extend to the outside of the areas A1, A2 in the Y direction. What is important is that each of the thin portions is formed in an area connecting the relevant power semiconductor element and the relevant recess portion, and formation of the thin portion in a part of the area, formation of the thin portion in the entire area and formation of the thin portion beyond the area each can reduce the possibility of concentration of stress on the recess portion.

Also, the thin portion of each heat sink largely deforms with heat compared to the other parts of the heat sink, and in the semiconductor device 2 according to the present embodiment, when the power semiconductor elements generate heat, the thin portions deform so as to bend toward the inside of the semiconductor device. Thus, tensile stress on the parts of contact between the package 9 and the heat sinks when the heat sinks thermally expand decreases. Therefore, reliability of the parts of adhesion between the package 9 and the heat sinks in respective outer peripheral portions of the heat sinks can be enhanced.

A semiconductor device according to Embodiment 2 will be described. In the below, only differences with Embodiment 1 will be described, and detailed description of components that are the same as those of Embodiment 1 will be omitted. The same applies to the other embodiments.

Figure 8:
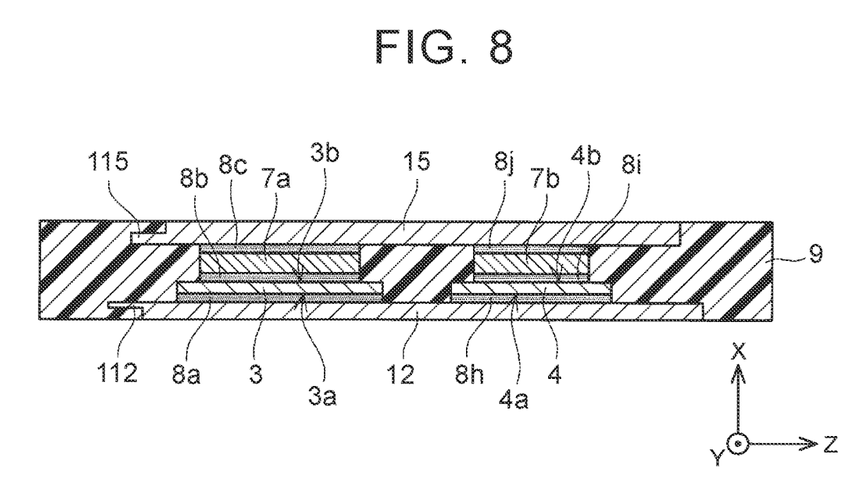
FIG. 8 is a vertical sectional view of a semiconductor device according to Embodiment 2 (corresponding to FIG. 7 in Embodiment 1)

As illustrated in FIG. 8, in the semiconductor device according to Embodiment 2, each of thin portions 112, 115 of heat sinks 12, 15 are covered by a package 9. Each thin portion is sealed by the package 9 and is not exposed outside. Although not illustrated, thin portions 122, 125 of heat sinks 22, 25 each have a configuration similar to that of the heat sinks 12, 15. This configuration enables increase in area of contact between the heat sinks and the package 9, and thus enables further enhancement in power semiconductor element protection performance.

Figure 9:
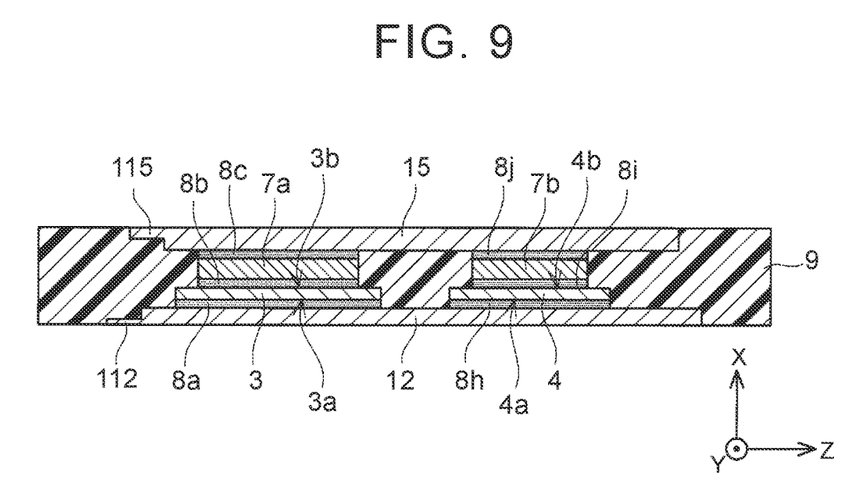
FIG. 9 is a vertical sectional view of a semiconductor device according to Embodiment 3 (corresponding to FIG. 7 in Embodiment 1)

As illustrated in FIG. 9, in a semiconductor device according to Embodiment 3, thin portions 112, 115 are formed by reducing a thickness of respective parts on the inner face side of the heat sink 12, 15. The thin portions 112, 115 are formed by dents that are present in the inner faces of the heat sinks 12, 15, and the dents are sealed by the package 9. Although not illustrated, thin portion 122, 125 of heat sinks 22, 25 have a configuration similar to that of the heat sinks 12, 15. The configuration of the heat sinks in the present embodiment can be regarded as a configuration obtained by vertically reversing each of the heat sinks in Embodiment 1 and sealing the dents (thin portions) of the heat sinks with a package. This configuration also enables reduction of concentration of stress on recess portions 90.

Figure 10:
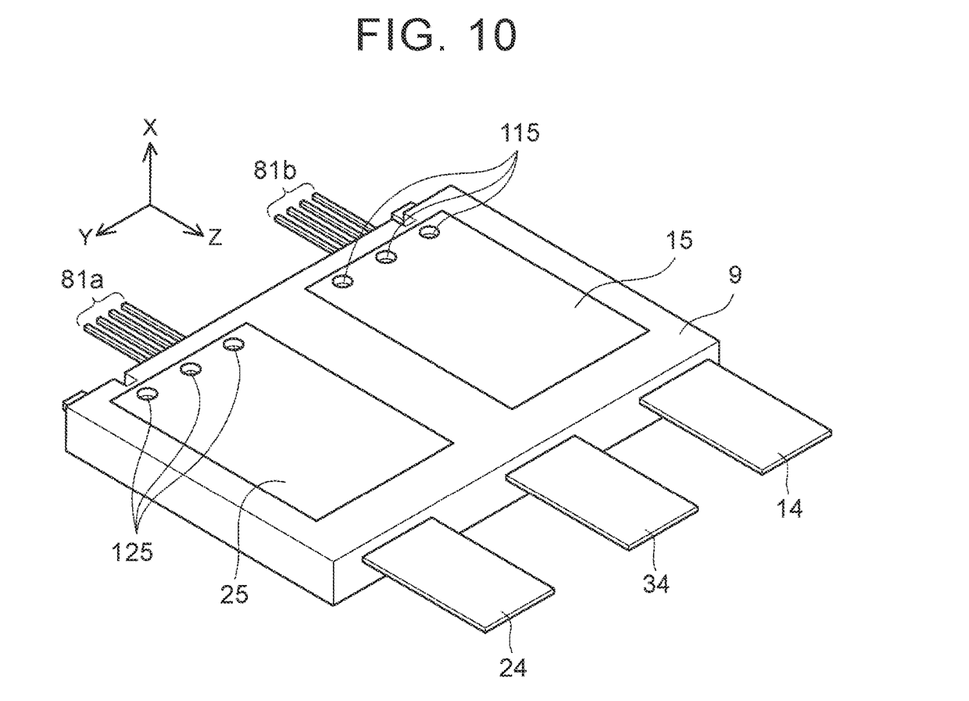
FIG. 10 is a perspective view of a semiconductor device according to Embodiment 4.

As illustrated in FIG. 10, in a semiconductor device according to Embodiment 4, thin portions 115, 125 are formed by cutting a plurality of parts (in the present embodiment, three parts along the Y-axis direction on the periphery of an end portion in the negative direction of the Z axis) in an outer face of each of heat sinks 15, 25 into a cylindrical shape. The thin portions 115, 125 do not extend through the respective heat sinks vertically. Although not illustrated, thin portions 112, 122 of heat sinks 12, 22 have a configuration similar to that of the heat sinks 15, 25. Also, each of the thin portions 112, 122 is also located on a shortest distance between a relevant power semiconductor element and a relevant recess portion. This configuration causes stress generated by thermal expansion of the heat sinks to be dispersed toward the inside of the thin portions, enabling reduction of concentration of stress on the recess portions 90.

Figure 11:
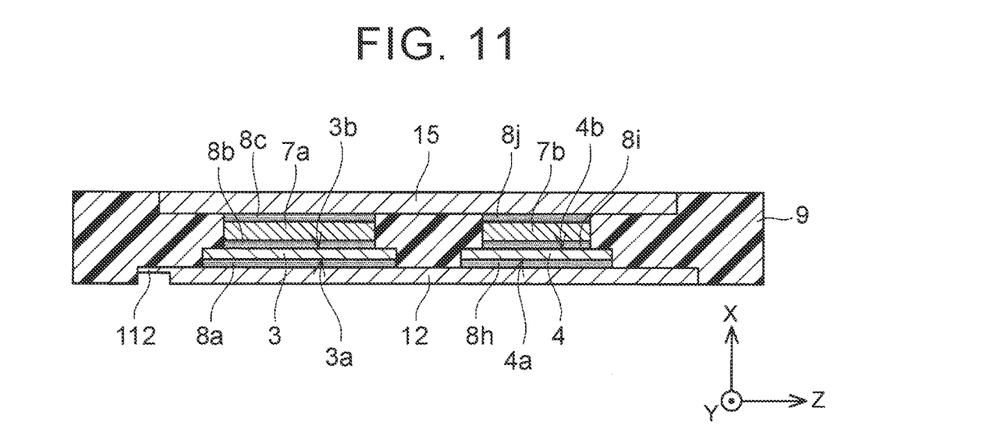
FIG. 11 is a vertical sectional view of a semiconductor device according to Embodiment 5 (corresponding to FIG. 7 in Embodiment 1).

As illustrated in FIG. 11, in a semiconductor device according to Embodiment 5, thin portions 112, 122 are formed only in heat sinks 12, 22 positioned on the lower face side of the semiconductor device (the heat sink 22 and the thin portion 122 are not illustrated). Since the lower face-side heat sinks 12, 22 are close to power semiconductor elements compared to those on the upper face side, the heat sinks 12, 22 thermally expand more largely with heat generated by the power semiconductor elements. Thus, compared to thermal expansion of the upper face-side heat sinks 15, 25, the effect of stress on the package 9 is large. In this configuration, the thin portions 112, 122 are formed in the lower face-side heat sinks 12, 22, which are more greatly affected by stress, enabling reduction of stress imposed on recess portions 90.

Although in the above embodiments, a thin portion is formed on one side of each heat sink, a thin portion may be formed at opposite end portions of each of two sides extending in the Y-axis direction of each heat sink. This configuration enables further reduction of stress imposed on the package 9.

Also, the above embodiments have been described in detail in terms of the case where recess portions 90 for securing a creepage distance are formed. However, the technique disclosed in the present description may be applied to a case where recess portions for improving fluidity during molding are provided in an outer peripheral end face of a package. For such case, also, stress concentrated on the recess portions can be reduced by forming thin portions in heat sinks. In other words, irrespective of positions at which the recess portions are formed in an outer peripheral end face of a package, stress imposed on each recess portion can be reduced by forming a thin portion within an area connecting a relevant power semiconductor element and the recess portion. Here, for a configuration of the thin portions, any of the thin portion configurations in the above-described embodiment may be used.

The power semiconductor elements (the first transistor element 3, the first diode element 4, the second transistor element 5 and the second diode element 6) in the embodiments are examples of semiconductor elements.

Technical elements disclosed in the present description are listed below. Each of the below technical elements is useful independently.

In a semiconductor device that is an example disclosed in the present description, thin portions are configured as a result of an outer face of each heat sink being dented. The dent may be a hollow cavity or may be covered by a package. This configuration enables securement of an area of contact between the heat sink and the package and thus enables maintenance of semiconductor element protection performance. Also, where the thin portions are hollow, concentration of stress on recess portions can be more reduced.

In a semiconductor device that is an example disclosed in the present description, thin portions may be in contact with outer peripheral end portions of respective heat sinks. This configuration further reduces stress imposed on recess portions.

In the above aspect, in the thin area, the outer face of the heat sink may be dented.

In the above aspect, the thin area may be in contact with the outer peripheral end portion of the heat sink.

In the above aspect, a part of the second surface of the heat sink may be exposed from the package.

In the above aspect, the package may include a resin.

The semiconductor device in the above aspect may further include a control electrode for inputting a control signal to the semiconductor element, wherein the heat sink may include a projection portion exposed outside the package, the control electrode and the projection portion may have different electric potentials, and the recess portion may be disposed between the control electrode and the projection portion.

In the above aspect, the semiconductor element may have a polygonal shape having outer sides, the recess portion may be a rectangular cutout, the thin portion may be located in a region connecting opposite ends of the outer side closest to the recess portion and opposite ends of a bottom face of the cut out as the cutout is viewed from an upper side.

In the above aspect, in the thin portion, the second surface may be dented.

In the above aspect, the heat sink may have a polygonal shape including outer sides, and the thin portion may be formed along the outer side closest to the recess portion.

In the above aspect, the thin portion may be surrounded by the thick portion.

What is claimed is:

1. A semiconductor device comprising:
   a semiconductor element including an outer peripheral end face;
   a heat sink including an inner face, an outer face and an outer peripheral end face, the semiconductor element being fixed to the inner face; and
   a package covering the outer peripheral end face of the semiconductor element, the inner face of the heat sink except an area to which the semiconductor element is fixed, and the outer peripheral end face of the heat sink, wherein
   the outer face of the heat sink is not covered by the package,
   a recess portion is formed in an outer peripheral end face of the package,
   the heat sink includes a thin area having a thin area outer face opposite the inner face of the heat sink, the thin area includes a thickness between the thin area outer face and the inner face of the heat sink that is smaller than a thickness between the outer face of the heat sink and the inner face of the heat sink of a part surrounding the thin area, the thin area is formed adjacent the outer peripheral end face of the heat sink and adjacent the outer peripheral end face of the package in which the recess area is formed, the thin area outer face is positioned on an inner side of the outer face of the heat sink in a thickness direction of the semiconductor device,
   wherein the package is not formed on the thin area outer face of the thin area,
   wherein a portion of the inner face of the heat sink opposite the thin area outer face contacts the package in the thin area.

2. The semiconductor device according to claim 1, wherein in the thin area, the outer face of the heat sink is dented.

3. The semiconductor device according to claim 1, wherein
   the thin area is provided between the recess portion and the semiconductor element when the thin area is seen from a direction perpendicular to the inner face of the heat sink.

4. The semiconductor device according to claim 1, wherein the package is not formed on a face of the thin portion opposite the first surface of the heat sink.

5. A semiconductor device comprising:
   a semiconductor element;
   a heat sink including a first surface and a second surface, the semiconductor element being joined to the first surface, the second surface being a surface on an opposite side of the first surface; and
   a package that is in contact with the semiconductor element and the first surface of the heat sink, the package including a recess portion in an outer face, wherein
   the heat sink includes a thick portion, and a thin portion having a thickness that is smaller than that of the thick portion,
   the thin portion is located on a line connecting an outer face of the semiconductor element and the recess portion in a shortest distance, and
   the thin portion is formed as a generally cylindrically shaped dent that extends from the second surface of the heat sink towards the first surface of the heat sink
   wherein an entire surface of the heat sink which faces inside of the semiconductor device contacts the package in the thin portion.

6. The semiconductor device according to claim 5, wherein the thin portion only extends partially through the heat sink from the second surface towards the first surface.

7. The semiconductor device according to claim 5, wherein a part of the second surface of the heat sink is exposed from the package.

8. The semiconductor device according to claim 5, wherein the package includes a resin.

9. The semiconductor device according to claim 5, wherein the thin portion is surrounded by the thick portion.

* * * * *

UNITED STATES PATENT AND TRADEMARK OFFICE
CERTIFICATE OF CORRECTION

PATENT NO. : 10,283,429 B2
APPLICATION NO. : 15/274247
DATED : May 7, 2019
INVENTOR(S) : Shingo Iwasaki and Tomomi Okumura It is certified that error appears in the above-identified patent and that said Letters Patent is hereby corrected as shown below:

On the Title Page

Item (73) - Assignee: delete "Toyota Jidosha Kabushiki Kaisha and Denso Corporation" and insert --Toyota Jidosha Kabushiki Kaisha--, therefor.

Signed and Sealed this
Twenty-fifth Day of June, 2019

Andrei Iancu
*Director of the United States Patent and Trademark Office*